US007138328B2

(12) United States Patent
Downey et al.

(10) Patent No.: US 7,138,328 B2
(45) Date of Patent: Nov. 21, 2006

(54) PACKAGED IC USING INSULATED WIRE

(75) Inventors: Susan H. Downey, Austin, TX (US); Peter R. Harper, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 47 days.

(21) Appl. No.: 10/847,775

(22) Filed: May 18, 2004

(65) Prior Publication Data

US 2004/0217458 A1  Nov. 4, 2004

(51) Int. Cl.
*H01L 21/44* (2006.01)
*H01L 29/40* (2006.01)
*B23K 31/00* (2006.01)

(52) U.S. Cl. .................. 438/617; 438/106; 228/179.1; 228/904; 257/784

(58) Field of Classification Search ............... None
See application file for complete search history.

(56) References Cited

U.S. PATENT DOCUMENTS

| 4,439,255 A | * | 3/1984 | Imai et al. ............... 156/49 |
| 4,488,674 A | | 12/1984 | Egawa |
| 4,678,114 A | * | 7/1987 | Egawa et al. ............ 228/176 |
| 4,722,852 A | | 2/1988 | Hoeberechts |
| 4,821,148 A | * | 4/1989 | Kobayashi et al. ....... 361/728 |
| 4,860,941 A | | 8/1989 | Otto |
| 5,021,401 A | * | 6/1991 | Snyder et al. ............ 505/434 |
| 5,208,467 A | * | 5/1993 | Yamazaki ................ 257/667 |
| 5,285,949 A | * | 2/1994 | Okikawa et al. ....... 228/179.1 |
| 5,350,638 A | | 9/1994 | Sawada |
| 5,372,886 A | | 12/1994 | Inazawa |
| 5,376,602 A | * | 12/1994 | Nilsen .................... 501/97.3 |
| 5,396,104 A | * | 3/1995 | Kimura ................... 257/784 |
| 5,402,006 A | | 3/1995 | O'Donley |
| 5,443,905 A | | 8/1995 | Sawada |
| 5,446,124 A | * | 8/1995 | Niwano et al. ............ 528/361 |
| 5,455,745 A | | 10/1995 | Weiler |
| 5,468,557 A | | 11/1995 | Nishio |
| 5,527,742 A | | 6/1996 | Weiler |
| 5,554,443 A | * | 9/1996 | Kondo et al. ............. 428/375 |
| 5,824,568 A | * | 10/1998 | Zechman ................. 438/112 |
| 5,950,100 A | * | 9/1999 | Shingai ................... 438/617 |
| 5,951,813 A | * | 9/1999 | Warren ................... 156/305 |
| 6,043,563 A | * | 3/2000 | Eldridge et al. .......... 257/784 |
| 6,046,075 A | * | 4/2000 | Manteghi ................. 438/123 |
| 6,177,726 B1 | | 1/2001 | Manteghi |

(Continued)

FOREIGN PATENT DOCUMENTS

EP  0276940  *  3/1988

(Continued)

*Primary Examiner*—Carl Whitehead, Jr.
*Assistant Examiner*—James M. Mitchell
(74) *Attorney, Agent, or Firm*—David G. Dolezal; Ranjeev Singh

(57) ABSTRACT

A packaged IC including insulated wire for electrically connecting conductive structures of the packaged IC. In some embodiments, the packaged IC includes an IC die attached to a package substrate, where bond pads of the IC die are electrically connected to bond fingers of the substrate with insulated wire. The insulated wire has a conductive core and an insulator coating. In some examples, the insulator coating includes an inorganic covalently-bonded substance that is not an oxide of the electrically conductive core such as, e.g., silicon nitride or silicon oxide. In one example, the insulator coating is applied to a conductive core by a chemical vapor deposition (CVD) process such as a plasma enhanced chemical vapor deposition (PECVD).

23 Claims, 2 Drawing Sheets

U.S. PATENT DOCUMENTS

| | | | |
|---|---|---|---|
| 6,756,670 B1 * | 6/2004 | Yamazaki et al. | 257/729 |
| 2001/0017221 A1 | 8/2001 | Horiuchi | |
| 2002/0089069 A1 * | 7/2002 | Lamson et al. | 257/784 |
| 2002/0130407 A1 * | 9/2002 | Dahl et al. | 257/712 |

FOREIGN PATENT DOCUMENTS

| | | | |
|---|---|---|---|
| EP | 0276940 A2 | | 8/1988 |
| EP | 0342681 B1 | | 11/1989 |
| JP | 355136514 A | | 10/1980 |
| JP | 0276940 | * | 1/1988 |
| JP | 01292849 | | 11/1989 |
| JP | 402044738 | * | 2/1990 |
| JP | 402270217 A | | 11/1990 |
| JP | 403064811 A | | 3/1991 |
| JP | 404158557 | * | 6/1992 |
| JP | 404315445 A | | 11/1992 |
| JP | 406268100 | * | 3/1993 |
| WO | WO98/26452 | | 6/1998 |

* cited by examiner

PACKAGED IC USING INSULATED WIRE

BACKGROUND OF THE INVENTION

1. Field of the Invention

This invention relates in general to packaged integrated circuits (ICs) in general and specifically to insulated wires for packaged ICs.

2. Description of the Related Art

Packaged ICs utilize wires for electrically coupling conductive structures encapsulated in an IC package. For example, wires may be used to electrically connect bond pads of an integrated circuit (IC) die with devices of a package substrate. Wires may also be used to cross connect bond pads of a die in the package or to cross connect bond fingers of a substrate.

A problem with using wires in a packaged IC is that a wire may unintentionally short to other conductive structures of the packaged IC such as, e.g., other wires, pads, fingers, or the die. This shorting may occur during IC die encapsulation as, for example, from "sweeping," where the injection or transfer of the liquid molding encapsulant moves the wires against another conductive structure.

An insulator coating may be applied to wires utilized in an IC package. However such insulator coatings need to be compatible with wire bonding processes and provide the insulative electrical properties as desired. What is needed is an improved wire insulator coating for packaged ICs.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
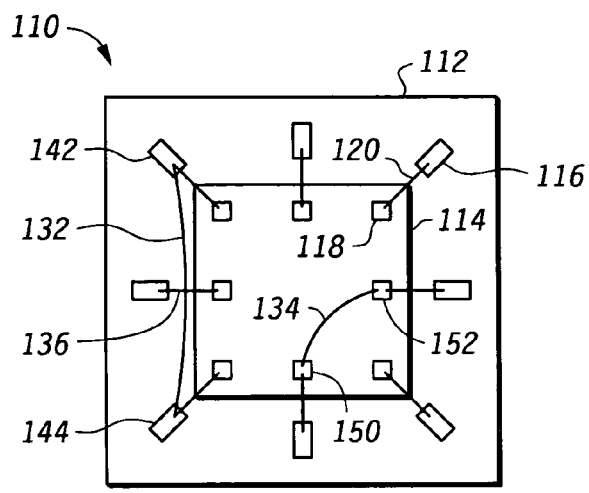
FIG. 1 is a top view of one embodiment of an IC die attached to a package substrate and including wires for electrically connecting electrically conductive structures of the IC die and substrate according to the present invention.

FIG. 1 is a top view of one embodiment of an IC die 114 attached to package substrate 112 prior to an encapsulation of IC die 114. Wires (e.g. 120) are utilized to electrically connect bond pads (e.g. 118) on IC die 114 with bond fingers (e.g. 116) of package substrate 112. Wires are also utilized for electrically connecting bond fingers of substrate 112 to each other. For example, wire 132 electrically connects substrate bond finger 142 with bond finger 144. Also wires can be utilized to electrically connect IC bond pads with each other. For example, wire 134 electrically connects bond pad 150 with bond pad 152.

Figure 2:
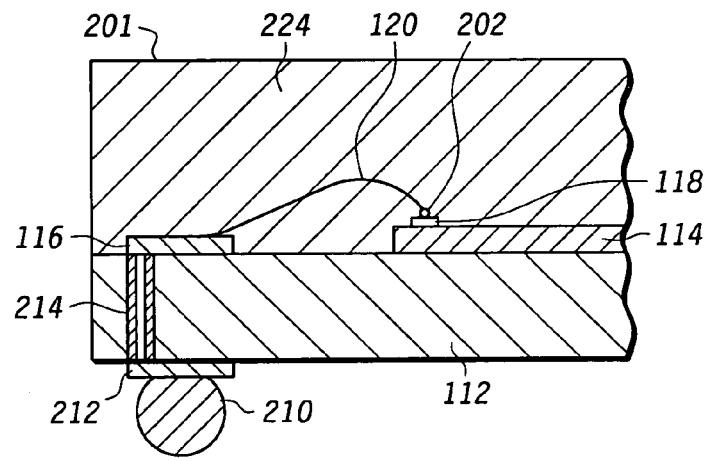
FIG. 2 is partial cut away side view of one embodiment of a packaged IC according to the present invention.

The wires shown in FIG. 1 have an insulator coating surrounding a conductive core for preventing the wires from shorting to other wires or other conductive structures of the packaged IC (201 of FIG. 2). For example, the insulative coating on wires 132 and 136 would prevent the conductive cores of those wires from shorting to each other in the event that the wires contact each other.

Figure 3:
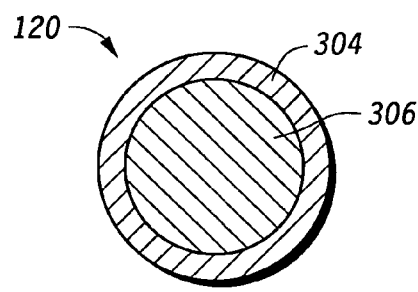
FIG. 3 is a cross sectional view of one embodiment of a wire with an insulator coating according to the present invention.

Referring to FIG. 3, insulator coating 304 surrounds conductive core 306. In some embodiments, the conductive core is made from a metal such as copper, gold, or aluminum.

In one embodiment, insulator coating 304 includes an inorganic covalently-bonded substance having insulative properties such that the thickness of the coating is sufficient to meet the insulative requirements of the IC package. An inorganic covalently-bonded substance is a covalently-bonded substance that does not include a compound with carbon and another element. Examples of an inorganic covalently-bonded substance that have insulative properties such that it can be used in the insulative coating include nitrides such as, e.g. silicon nitride, aluminum nitride, and boron nitride; oxides such as e.g. silicon oxide, titanium oxide, magnesium oxide, tantalum oxide, boron oxide, beryllium oxide, phosphorous oxide, vanadium oxide, chromium oxide, zirconium oxide; carbides such as silicon carbide; silicon oxynitride; and diamond and diamond-like carbon. In some embodiments, the oxides that may be used are not oxides of the material of the conductive core. In some examples, the insulative coating is applied by a chemical vapor deposition (CVD) process such as, e.g., a plasma enhanced CVD (PECVD) process prior to the attachment of the wire to the electrically conductive structure of the die and substrate.

In some embodiments, the inorganic covalently-bonded substance of the insulator coating has a high breakdown voltage such that it that can provide the desired insulative properties with a relatively thin coating. In one embodiment, the insulative coating include stoichiometric silicon oxide ($SiO_2$). In one example, a wire having a conductive core of gold would have a insulator coating of $SiO_2$ having a thickness of 15–10,000 angstroms. However, in some embodiments, the thickness of the insulator coating should be minimized to allow the wire to be bent without cracking the insulator coating.

FIG. 2 is a partial cutaway view of a packaged IC 201 that includes substrate 112 and IC die 114 encapsulated in an encapsulant 224. Wire 120 electrically connects bond pad 118 to substrate bond finger 116. Bond finger 116 is connected to plated via 214, which is connected to ball grid array (BGA) pad 212. Ball 210 is electrically connected to pad 212 and as is utilized for the electrically coupling IC die 114 to external devices.

Wire 120 is attached to pad 118 by thermosonically bonding a formed ball 202 to pad 118 and wire 120. Wire is then routed to bond finger 116 where it is attached to bond finger 116 by wedge bonding wire 120 to bond finger 116 and then cutting the excess wire from bond finger 116. In other embodiments, both ends of the wire are attached by wedge bonding or by other conventional wire attachment techniques.

In some embodiments, the insulator coating including an inorganic covalently-bonded substance has a material hardness greater than and is more brittle than the conductive core. Accordingly the insulator coating provides an "egg shell" effect with respect to the conductive core. The brittle nature of the insulator coating may aid in the wedge bonding of the wire to a conductive structure. With these embodiments, the insulator coating material easily cracks at the point of attachment wherein small particles of the insulator become embedded in the softer conductive core material. Also, in some embodiments, the material hardness of the insulator coating aids in ability of the coating to withstand wear from friction such as e.g. from two wires rubbing together during e.g. the bonding or encapsulation process.

In some embodiments, the melting point of the inorganic covalently-bonded substance of the insulator coating is higher than that of the conductive core material. During the ball formation for the attachment of the wire to a pad or finger (e.g. during the attachment of wire 120 to pad 118), the conductive core material melts wherein insulator coating material covering the melted portion of the core becomes embedded as particulate matter in the ball. However, because insulator coating material has a higher melting point than the conductive core material, the insulator coating remains on the portions of the wire whose conductive core was not melted.

Referring back to FIG. 2, wires having an insulator coatings may be utilized in other types of packaged ICs. For example, wires with insulator coatings may be utilized to connect die pads of multiple IC dies located in a multi die IC package (such as, e.g., in a stacked die or side by side die packaged IC). Wires having insulator coatings may also be used in leaded packaged IC to connect the bond pads of the IC die to the lead frame of the leaded packaged IC. Wires having insulator coatings may also be used in other types of packages such as e.g. quad flat package (QFP), small outline integrated circuit (SOIC), quad flat package no leads (QFN), plastic ball grid array (PBGA), tape ball grid array (TBGA), and chip scale package (CSP). In addition, wires having insulator coatings may also be used to connect other types of conductive structures in a packaged IC.

Figure 4:
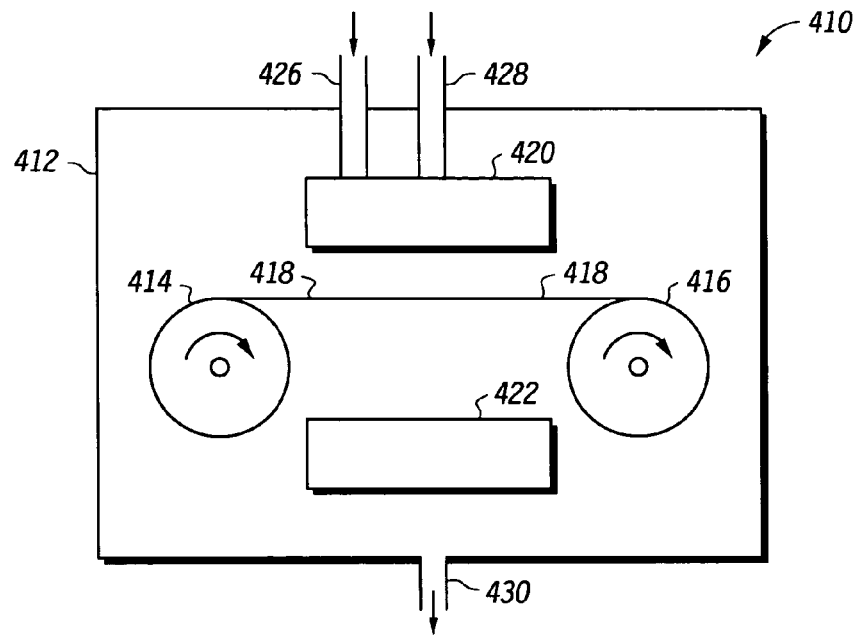
FIG. 4 is a view of one embodiment of a chemical vapor deposition system for coating a conductive core with an insulator coating according to the present invention.

FIG. 4 shows one embodiment of a chemical vapor deposition (CVD) system 410 for coating a conductive core (e.g. 306) with an insulator coating (e.g. 304) according to the present invention. In the embodiment shown, CVD system 410 is configured to perform plasma enhanced chemical vapor deposition (PECVD) on a conductive core 418, which is initially stored, uncoated, on reel 414. CVD system 410 includes a deposition chamber 412 with wire reels 414 and 416 located therein. Also located in chamber 412 are a gas manifold 420 and a bottom plate 422. Reactive species gas is introduced into chamber 412 through gas inlets 426 and 428 and gas manifold 420. Exhaust gas is removed from chamber 412 via exhaust tube 430.

A radio frequency (RF) plasma discharge is generated between gas manifold 420 and bottom plate 422 which causes a chemical reaction between the reactive species. The bottom plate 422 may be heated to 200–400 C to aid in the chemical reaction. This chemical reaction causes a vapor deposition in the deposition zone (located between manifold 420 and bottom plate 422) of the insulator coating material on the portion of conductive core 418 located between reel 414 and 416. As reels 414 and 416 are rotated in a clockwise direction, relative to the view shown in FIG. 4, an insulator coating (e.g. 304) is applied to the conductive core 418 as it passes through the deposition zone. System 410 may include other conventional CVD equipment not shown. In one embodiment, ammonia (NH4) is introduced in inlet 426 and silane (SiH4) diluted in helium is introduced in inlet 428 to cause a chemical reaction for the deposition of silicon nitride on the conductive core 418.

The thickness of the coating deposited on the conductive core 418 is controlled by the amount and/or rate of reactive species gas introduced in chamber 412, the RF power applied to manifold 420 and plate 422, the vacuum pumping rate in which gas is removed from tube 430, and the spool rate that conductive core 418 is transferred from reel 414 to reel 416. The PECVD occurs at a sufficiently low temperature to avoid melting the conductive core.

In other embodiments, other types of CVD processes may be utilized to apply an insulator coating on a conductive core. In addition, other methods for applying an insulator coating may be used such as, e.g., sputtering and evaporation. However, CVD processes provide for a faster and more uniform application of the insulator coating material.

Figure 5:
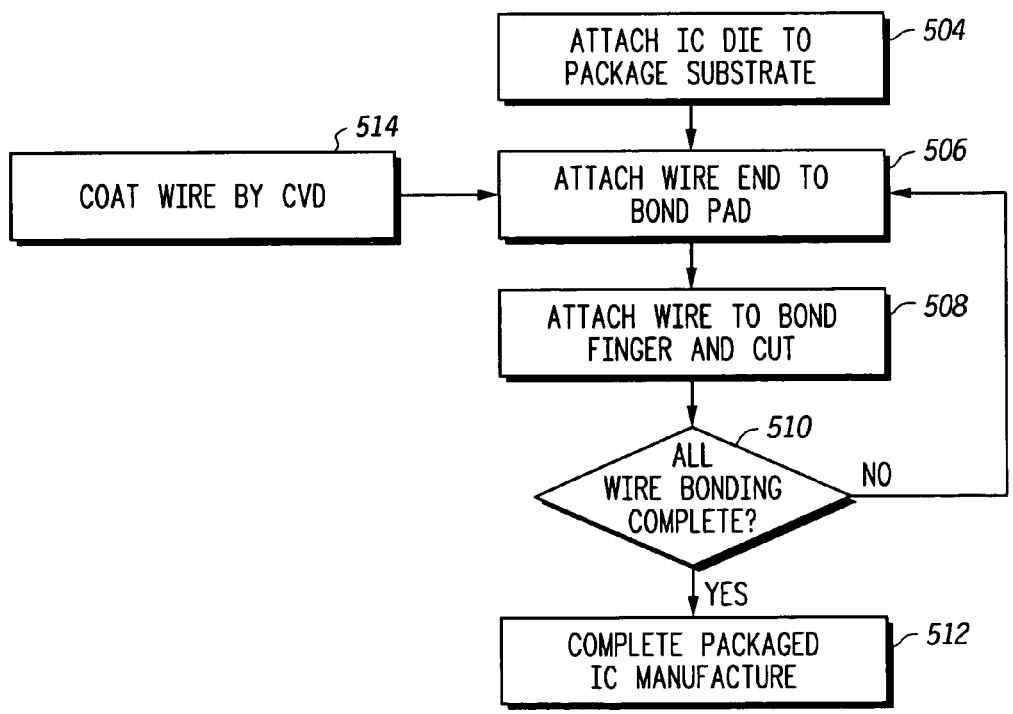
FIG. 5 is a flow chart setting forth one embodiment of a method of manufacturing a packaged IC according to the present invention.

FIG. 5 is a flow chart setting forth one embodiment of a method of manufacturing a packaged IC according to the present invention. In 504, IC die 114 is attached to substrate 112. After 504, the wires having an insulator coating formed by a CVD process in 514 are attached to bond fingers of the substrate and bond pads of the IC die. During the manufacturing process, wire having an insulator coating is initially located on a spool (not shown). In 506, the end of the wire (not shown) extending from the spool is attached to a bond pad (e.g. pad 118) of a die by thermosonically a formed ball (e.g. 202) to the pad and the wire end. In 508, the wire is then positioned over a bond finger (e.g. 116) where it is wedge bonded to the bond finger and cut from the remaining portion of the wire on the spool. If there are other wires to be implemented in the packaged IC, in 506, the new end of the wire from the spool (formed by the cutting in 508) is attached to another bond pad by thermosonically bonding a formed ball to the pad and the new end of the wire, and in 508, the wire is wedged bonded to the second bond finger and cut from the remaining portion of the wire on the spool. When all of the wires of the package have been installed, in 512, other processes are performed to complete the manufacturing of the packaged IC, including the encapsulation of the devices of the package (e.g. die 114, the wires and portions of the substrate such as e.g. shown in the embodiment of FIG. 2). In other embodiments, other manufacturing processes may be utilized.

In one aspect of the invention, a packaged integrated circuit (IC) includes an IC die having a plurality of sides, a first plurality of conductive structures, a second plurality of conductive structures, and a plurality of wires. Each wire of the plurality electrically connects a conductive structure of the first plurality of conductive structures to a conductive structure of the second plurality of conductive structures. Each wire of the plurality of wires includes an electrically conductive core with an insulator coating around the electrically conductive core. The insulator coating includes an inorganic covalently-bonded substance that is not an oxide of the electrically conductive core. The packaged IC also includes an encapsulant covering the plurality of wires and at least one side of the IC die.

In another aspect, the invention includes a method of making a packaged integrated circuit (IC). The method includes providing an IC die, providing a conductive core, and applying an insulator coating around the conductive core by a chemical vapor deposition process to form an insulated wire. The method also includes electrically connecting a first conductive structure with a second conductive structure with the insulated wire and encapsulating at least a portion of each of the IC die, the first conductive structure, the second conductive structure, and the insulated wire.

In another aspect of the invention, a wire includes a metal core and an insulator coating around the core. The insulator coating includes at least one of silicon nitride and silicon oxide.

In another aspect of the invention, a packaged integrated circuit (IC) includes a package substrate having a plurality of package bond fingers, an IC die mounted on the package substrate and having a plurality of IC bond pads, and a plurality of wires. Each of the plurality of wires connects a package bond finger of the plurality of package bond fingers to a IC bond pad of the plurality of IC bond pads. Each of the plurality of wires includes a metal core with an insulator coating including at least one of silicon nitride, silicon oxynitride, and silicon oxide. The packaged IC also includes an encapsulant covering the plurality of wires and at least one side of the IC die.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a packaged integrated circuit (IC), comprising:
   providing an IC die having a first conductive structure;
   providing a substrate having a second conductive structure;
   providing a conductive core;
   applying an insulator coating only around the conductive core by a chemical vapor deposition process to form an insulated wire, wherein the insulator coating includes an inorganic covalently-bonded substance that is not an oxide of the conductive core prior to electrically connecting the first conductive structure with the second conductive structure with the insulated wire; and
   encapsulating at least a portion of each of the IC die, the first conductive structure, the second conductive structure, and the insulated wire.

2. The method of claim 1, wherein the inorganic covalently-bonded substance is silicon nitride.

3. The method of claim 1, wherein the insulator coating has a thickness of 10,000 angstroms or less.

4. The method of claim 1, wherein the first conductive structure is a bond pad of the IC die.

5. The method of claim 4, wherein the insulated wire is connected to the bond pad of the IC die by thermosonically bonding a ball to a pad and the insulated wire.

6. The method of claim 1, wherein the conductive core includes copper.

7. The method of claim 1, wherein the insulator coating has a higher melting temperature than that of the conductive core.

8. The method of claim 1, wherein the insulator coating has a thickness of at least 15 Angstroms.

9. The method of claim 1, where in the insulator coating has a material hardness greater than that of the conductive core.

10. The method of claim 1, wherein the second conductive structure is a bond finger.

11. The method of claim 10, wherein the insulated wire is connected to the bond finger by wedge bonding the insulated wire to the bond finger and then cutting any excess amount of the insulated wire, if necessary.

12. A method of making a packaged integrated circuit (IC), comprising:
   providing an IC die having a first conductive structure;
   providing a substrate having a second conductive structure;
   electrically connecting the first conductive structure with the second conductive structure with an insulated wire, wherein the insulated wire is formed by applying an insulator coating only around a conductive core, wherein the insulator coating includes an inorganic covalently-bonded substance that is not an oxide of the conductive core; and
   encapsulating at least a portion of each of the IC die, the first conductive structure, the second conductive structure, and the insulated wire.

13. The method of claim 12, wherein the inorganic covalently-bonded substance is silicon nitride.

14. The method of claim 12, wherein the insulator coating has a thickness of 10,000 angstroms or less.

15. The method of claim 12 wherein the first conductive structure is a bond pad of the IC die.

16. The method of claim 15, wherein the insulated wire is connected to the bond pad of the IC die by thermosonically bonding a ball to a pad and the insulated wire.

17. The method of claim 12, wherein the conductive core includes copper.

18. The method of claim 12, wherein the insulator coating has a higher melting temperature than that of the conductive core.

19. The method of claim 12, wherein the insulator coating has a thickness of at least 15 Angstroms.

20. The method of claim 12, where in the insulator coating has a material hardness greater than that of the conductive core.

21. The method of claim 12, wherein the insulator coating has thickness of at least 15 Angstroms.

22. The method of claim 12, wherein the second conductive structure is a bond finger.

23. The method of claim 22, wherein the insulated wire is connected to the bond finger by wedge bonding the insulated wire to the bond finger and then cutting any excess amount of the insulated wire, if necessary.

* * * * *